US009028924B2

(12) United States Patent
Haverkamp et al.

(10) Patent No.: US 9,028,924 B2
(45) Date of Patent: May 12, 2015

(54) IN-SITU DEPOSITION OF FILM STACKS

(71) Applicant: Novellus Systems, Inc., Fremont, CA (US)

(72) Inventors: Jason Haverkamp, Scotia, NY (US); Pramod Subramonium, Beaverton, OR (US); Joe Womack, Tigard, OR (US); Dong Niu, West Linn, OR (US); Keith Fox, Tigard, OR (US); John Alexy, West Linn, OR (US); Patrick Breiling, Portland, OR (US); Jennifer O'Loughlin, Portland, OR (US); Mandyam Sriram, San Jose, CA (US); George Andrew Antonelli, Portland, OR (US); Bart van Schravendijk, Palo Alto, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/671,424

(22) Filed: Nov. 7, 2012

(65) Prior Publication Data
US 2013/0171834 A1 Jul. 4, 2013

Related U.S. Application Data

(63) Continuation-in-part of application No. 12/970,846, filed on Dec. 16, 2010, now Pat. No. 8,741,394.

(60) Provisional application No. 61/317,656, filed on Mar. 25, 2010, provisional application No. 61/382,465, filed on Sep. 13, 2010, provisional application No. 61/382,468, filed on Sep. 13, 2010, provisional application No. 61/394,707, filed on Oct. 19, 2010.

(51) Int. Cl.
| | |
|---|---|
| *H05H 1/24* | (2006.01) |
| *H01L 21/02* | (2006.01) |
| *C23C 16/24* | (2006.01) |
| *C23C 16/34* | (2006.01) |
| *C23C 16/40* | (2006.01) |
| *C23C 16/44* | (2006.01) |
| *C23C 16/455* | (2006.01) |
| *C23C 16/509* | (2006.01) |
| *C23C 16/54* | (2006.01) |

(52) U.S. Cl.
CPC ............ *H01L 21/0234* (2013.01); *C23C 16/24* (2013.01); *C23C 16/345* (2013.01); *C23C 16/402* (2013.01); *C23C 16/4401* (2013.01); *C23C 16/45523* (2013.01); *C23C 16/509* (2013.01); *C23C 16/54* (2013.01); *H01L 21/02123* (2013.01); *H01L 21/02164* (2013.01); *H01L 21/022* (2013.01); *H01L 21/02274* (2013.01)

(58) Field of Classification Search
USPC .................... 427/578, 579, 255.393, 255.394
See application file for complete search history.

(56) References Cited

U.S. PATENT DOCUMENTS

| | | | |
|---|---|---|---|
| 5,399,387 A | 3/1995 | Law et al. | |
| 5,589,233 A | 12/1996 | Law et al. | |
| 5,851,602 A | 12/1998 | Law et al. | |
| 6,066,550 A | 5/2000 | Wang | |
| 6,087,278 A | 7/2000 | Kim et al. | |
| 6,207,574 B1 | 3/2001 | Lee | |
| 6,235,650 B1 | 5/2001 | Yao | |
| 6,358,573 B1 | 3/2002 | Raoux et al. | |
| 6,407,011 B1 | 6/2002 | Ikeda et al. | |
| 6,444,277 B1 | 9/2002 | Law et al. | |
| 6,811,831 B1 | 11/2004 | Koutny et al. | |
| 6,818,533 B2 | 11/2004 | Chen et al. | |
| 6,962,859 B2 | 11/2005 | Todd et al. | |
| 7,422,776 B2 * | 9/2008 | Yim et al. ...................... 427/577 |
| 7,608,300 B2 * | 10/2009 | Bencher et al. ............ 427/248.1 |
| 7,635,651 B2 | 12/2009 | Lee et al. | |
| 7,858,431 B2 | 12/2010 | Isaka et al. | |
| 8,076,250 B1 * | 12/2011 | Rajagopalan et al. ........ 438/763 |

(Continued)

FOREIGN PATENT DOCUMENTS

| | | |
|---|---|---|
| DE | 101 43 235 A1 | 3/2003 |
| EP | 0 394 054 | 10/1990 |

(Continued)

OTHER PUBLICATIONS

Schulz, O., et al., "Silicon Oxide/Silicon Nitride Stack System for 20% Efficient Silicon Solar Cells". IEEE 2005, pp. 872-876.*
Bahari, A. et al., "Growth of a stacked silicon nitride/silicon oxide dielectric on Si (100)." J. Vac. Sci. Technol. B 24(4), Jul./Aug. 2006, pp. 2119-2123.*

(Continued)

*Primary Examiner* — Bret Chen
(74) *Attorney, Agent, or Firm* — Weaver Austin Villeneuve & Sampson LLP

(57) ABSTRACT

Methods of forming a film stack may include the plasma accelerated deposition of a silicon nitride film formed from the reaction of nitrogen containing precursor with silicon containing precursor, the plasma accelerated substantial elimination of silicon containing precursor from the processing chamber, the plasma accelerated deposition of a silicon oxide film atop the silicon nitride film formed from the reaction of silicon containing precursor with oxidant, and the plasma accelerated substantial elimination of oxidant from the processing chamber. Process station apparatuses for forming a film stack of silicon nitride and silicon oxide films may include a processing chamber, one or more gas delivery lines, one or more RF generators, and a system controller having machine-readable media with instructions for operating the one or more gas delivery lines, and the one or more RF generators.

14 Claims, 6 Drawing Sheets

(56) References Cited

U.S. PATENT DOCUMENTS

| | | | |
|---|---|---|---|
| 8,318,575 | B2 | 11/2012 | Lehnert et al. |
| 8,709,551 | B2 | 4/2014 | Fox et al. |
| 8,741,394 | B2 | 6/2014 | Haverkamp et al. |
| 2001/0007245 | A1 | 7/2001 | Weichart |
| 2002/0011656 | A1 | 1/2002 | Swanson et al. |
| 2004/0011279 | A1 | 1/2004 | Joo |
| 2004/0041239 | A1* | 3/2004 | Ruelke et al. ............... 257/637 |
| 2004/0087079 | A1* | 5/2004 | Chen et al. ................. 438/216 |
| 2004/0146661 | A1 | 7/2004 | Kapoor et al. |
| 2005/0040456 | A1 | 2/2005 | Specht et al. |
| 2005/0045099 | A1* | 3/2005 | Bencher et al. ............. 118/715 |
| 2005/0196960 | A1 | 9/2005 | Koo et al. |
| 2005/0229848 | A1 | 10/2005 | Shinriki et al. |
| 2005/0233591 | A1* | 10/2005 | Schmitt et al. ............... 438/706 |
| 2006/0049139 | A1* | 3/2006 | Xia et al. ..................... 216/67 |
| 2006/0204673 | A1 | 9/2006 | Takayasu et al. |
| 2006/0276011 | A1 | 12/2006 | Fogel et al. |
| 2007/0059942 | A1 | 3/2007 | Hu et al. |
| 2007/0110918 | A1 | 5/2007 | Yuda et al. |
| 2007/0144215 | A1 | 6/2007 | Kharas |
| 2007/0215877 | A1 | 9/2007 | Kato et al. |
| 2007/0264842 | A1 | 11/2007 | Kim |
| 2008/0050883 | A1 | 2/2008 | Enicks |
| 2008/0073645 | A1 | 3/2008 | Todd et al. |
| 2008/0113521 | A1 | 5/2008 | Tanaka et al. |
| 2008/0153300 | A1* | 6/2008 | Bok ............................ 438/703 |
| 2008/0202688 | A1 | 8/2008 | Wu et al. |
| 2008/0268176 | A1 | 10/2008 | Choi et al. |
| 2008/0299747 | A1 | 12/2008 | Arai et al. |
| 2009/0022908 | A1 | 1/2009 | Yang et al. |
| 2009/0035927 | A1* | 2/2009 | Olsen et al. ................. 438/585 |
| 2009/0095221 | A1 | 4/2009 | Tam et al. |
| 2009/0097105 | A1 | 4/2009 | Hart et al. |
| 2009/0104790 | A1 | 4/2009 | Liang |
| 2009/0159119 | A1 | 6/2009 | Basol |
| 2009/0246942 | A1 | 10/2009 | Imaeda et al. |
| 2009/0286402 | A1 | 11/2009 | Xia et al. |
| 2010/0012030 | A1 | 1/2010 | Todd et al. |
| 2010/0102359 | A1 | 4/2010 | Khan et al. |
| 2010/0109065 | A1 | 5/2010 | Oh et al. |
| 2010/0184302 | A1 | 7/2010 | Lee et al. |
| 2010/0210093 | A1 | 8/2010 | Kato et al. |
| 2011/0018044 | A1 | 1/2011 | Lim et al. |
| 2011/0036168 | A1 | 2/2011 | Lin |
| 2011/0151142 | A1 | 6/2011 | Seamons et al. |
| 2011/0236594 | A1* | 9/2011 | Haverkamp et al. .......... 427/553 |
| 2011/0236600 | A1 | 9/2011 | Fox et al. |
| 2012/0142172 | A1 | 6/2012 | Fox et al. |
| 2013/0157466 | A1* | 6/2013 | Fox et al. ..................... 438/694 |
| 2013/0267081 | A1 | 10/2013 | Fox et al. |
| 2013/0316518 | A1 | 11/2013 | Hollister et al. |
| 2014/0048141 | A1 | 2/2014 | Womack et al. |

FOREIGN PATENT DOCUMENTS

| | | |
|---|---|---|
| JP | 06-240459 A | 8/1994 |
| JP | 2000-208422 | 7/2000 |
| WO | WO 2009/098548 | 8/2009 |
| WO | WO2012/036808 | 3/2012 |
| WO | WO 2013/123143 | 8/2013 |

OTHER PUBLICATIONS

Zohni, Omar, et al., "Investigating thin film stresses in stacked silicon dioxide/silicon nitride structures and quantifying their effects on frequency response". J. Micromech. Microeng. 17 (2007) 1042-1051.*

Kim, Jinkuk, et al., "Double antireflection coating layer with silicon nitride and silicon oxide for crystalline silicon solar cell." J. Electroceram (2013) 20: 41-45.*

Zohni, Omar, et al., "Investigating thin film stresses in stacked silicon dioxide/silicon nitride structures and quantifying their effects on frequency response". J. Micromech Microeng. 17 (2007) 1042-1051.*

Gatz, S., et al., "Thermal stability of amorphous silicon/silicon nitride stacks for passivating crystalline silicon solar cells". Applied Physics Letters 93, 173502 (2008), pp. 1-3.*

Keipert-Colberg, Sinje, et al., "Investigation of a PECVD silicon oxide/silicon nitride passivation system concerning process influences". Presented at the 26$^{th}$ European PV Solar Energy Conference and Exhibition, Sep. 5-9, 2011, Hamburg, Germany, pp. 1-4.*

Schultz, O., et al., "Silicon Oxide/Silicon Nitride Stack System for 20% Efficient Silicon Solar Cells". IEEE article, pp. 872-876, 2005.*

International Search Report and Written Opinion mailed Apr. 9, 2012, issued in Application No. PCT/US2011/047107.

Jang, J., et al., "Vertical Cell Array Using TCAT (Terabit Cell Array Transistor) Technology for Ultra High Density NAND Flash Memory," *2009 Symposium on VLSI Technology Digest of Technical Papers*, 2009, pp. 192-193.

Kim, J., et al., "Novel Vertical-Stacked-Array-Transistor (VSAT) for Ultra-High-Density Cost-Effective NAND Flash Memory Devices and SSD (Sold State Drive)," *2009 Symposium on VLSI Technology Digest of Technical Papers*, 2009, pp. 186-187.

Kim, W., et al., "Multi-Layered Vertical Gate NAND Flash Overcoming Stacking Limit for Terabit Density Storage," *2009 Symposium on VLSI Technology Digest of Technical Papers*, 2009, pp. 188-189.

Ong, Y. et al., Process Analysis and Optimization on PECVD Amorphous Silicon on Glass Substrate, *Journal of Physics: Conference Series*, vol. 34, 2006, pp. 812-817.

U.S. Appl. No. 14/262,196, filed Apr. 25, 2014, entitled "In-Situ Deposition of Film Stacks," Haverkamp et al.

U.S. Appl. No. 13/907,742, filed May 31, 2013, entitled "Tensile Stressed Doped Amorphous Silicon," Fox et al.

US Final Office Action dated May 16, 2013 issued in U.S. Appl. No. 12/970,846.

US Office Action dated Sep. 11, 2013 issued in U.S. Appl. No. 12/970,846.

US Notice of Allowance dated Jan. 24, 2014 issued in U.S. Appl. No. 12/970,846.

US Office Action dated Apr. 9, 2013 issued in U.S. Appl. No. 12/970,853.

US Final Office Action dated Aug. 9, 2013 issued in U.S. Appl. No. 12/970,853.

US Notice of Allowance dated Dec. 18, 2013 issued in U.S. Appl. No. 12/970,853.

US Office Action dated Jan. 30, 2014 issued in U.S. Appl. No. 13/313,422.

US Final Office Action dated May 13, 2014 issued in U.S. Appl. No. 13/313,422.

US Office Action dated Feb. 5, 2014 issued in U.S. Appl. No. 13/478,999.

Singapore Search Report and Written Opnion dated Apr. 18, 2013, issued in SG 201102162-3.

Singapore Search and Examination Report dated Nov. 28, 2013, issued in SG 201102162-3.

PCT International Preliminary Report on Patentability and Written Opinion dated Mar. 28, 2013, issued in PCT/US2011/047107.

Singapore Search and Examination Report dated Mar. 13, 2014, issued in SG 201301550-8.

PCT International Search Report and Written Opinion dated Jun. 3, 2013, issued in PCT/US2013/026069.

"Diaphram Valves," (Oct. 2003) *Microelectronics Product Line*, Catalog 4505/USA, Parker Hannifin Corporation, pp. 1-49.

Han et al. (Jun. 1994) "Modeling the Properties of PECVD Silicon Dioxide Films Using Optimzed Back-Propagation Neural Networks," IEE Transaction on Components, Packaging, and Manufacturing Technology—Part A, 17(2):174-182.

Moisan, M., et al., (Oct. 1987) "New surface wave launchers for sustaining plasma columns at submicrowave frequencies (1-300 MHz)" *Rev. Sci. Instrum.* 58(10):1895-1900.

Hoogeland et al., (2009) "Plasma-assisted atomic layer deposition of TiN/Al$_2$O$_3$ stacks for metal-oxide-semiconductor capacitor applications," *Journal of Applied Physics* 106, 114107-1-114107-7, 7pp.

Schmidt et al., (2001) "Surface Passivation of silicon solar cells using plasma-enhanced chemical-vapour-deposited SiN films and thin thermal SiO$_2$/plasma SiN stacks." *Semicond. Sci. Technol.*, 16:164-170.

(56) References Cited

OTHER PUBLICATIONS

Su, Chen-Yi, et al., (2012) "Deposition and characterizaiton of MgO/Si gate stacks grown by molecular beam epitaxy," *Thin Solid Films* 520:4508-4511.

Viana et al. (Jun. 2001) "Analysis of $SiO_2$ Thin Film Deposited by PECVD using an Oxygen-TEOS-Argon Mixture," *Brazilian Journal of Physics*, 31(2):299-303.

US Office Action dated Jul. 10, 2014 issued in U.S. Appl. No. 13/857,566.

US Final Office Action dated Jul. 2, 2014 issued in U.S. Appl. No. 13/478,999.

US Notice of Allowance dated Jun. 23, 2014 issued in U.S. Appl. No. 13/907,742.

PCT International Preliminary Report on Patentability and Written Opinion dated Aug. 28, 2014, issued in PCT/US2013/026069.

* cited by examiner

IN-SITU DEPOSITION OF FILM STACKS

CROSS REFERENCE TO RELATED APPLICATIONS

This application is a continuation-in-part of, and claims priority to, U.S. patent application Ser. No. 12/970,846, filed Dec. 16, 2010, and titled "IN-SITU DEPOSITION OF FILM STACKS," which claims priority to: U.S. Provisional Patent Application No. 61/317,656, filed Mar. 25, 2010 and titled "IN-SITU PLASMA-ENHANCED CHEMICAL VAPOR DEPOSITION OF FILM STACKS"; U.S. Provisional Patent Application No. 61/382,465, filed Sep. 13, 2010, and titled "IN-SITU PLASMA-ENHANCED CHEMICAL VAPOR DEPOSITION OF FILM STACKS"; U.S. Provisional Patent Application No. 61/382,468, filed Sep. 13, 2010, and titled 'SMOOTH SILANE-BASED FILMS"; and U.S. Provisional Patent Application No. 61/394,707, filed Oct. 19, 2010, and titled "IN-SITU PLASMA-ENHANCED CHEMICAL VAPOR DEPOSITION OF FILM STACKS." Each of the foregoing provisional and non-provisional applications are hereby incorporated by reference herein in their entirety for all purposes.

BACKGROUND

Various thin film layers for semiconductor devices may be deposited by chemical vapor deposition (CVD) and/or plasma-enhanced chemical vapor deposition (PECVD) processes. Some deposition processes generate small gas phase particles during process, which may decorate a deposition surface, potentially contaminating the device. Such particles may cling to the device, potentially blocking subsequent etch and/or deposition events, which may ultimately lead to device failure. Further, particles may be knocked off the device downstream, potentially contaminating other process tools.

Some approaches to addressing gas-phase particle generation may attempt to suppress particle generation by diluting reaction conditions. However, such approaches may diminish film deposition rates, requiring the installation and maintenance of additional process tools to support a production line. Further, films produced by such approaches may have physical or electrical characteristics that provide inadequate device performance. Further still, such approaches may not address particles formed in various exhaust hardware for the process tool, which may back-stream and contaminate the device. These particles may be delivered to the substrate surface during deposition. Once coated by additional film material, the small size of the particles may be magnified, causing ripples and distortions at the film surface. These ripples may make it difficult to pattern the resulting films.

Patterning problems may also be caused by rough films. Some traditional atomic layer deposition (ALD), chemical vapor deposition (CVD), high-density plasma chemical vapor deposition (HDP-CVD) and plasma-enhanced chemical vapor deposition (PECVD) processes for depositing film layers may produce unacceptably rough films, cause unacceptable interfacial mixing between film layers, and may have interfacial defects caused by vacuum breaks between successively deposited film layers. The resulting rough film interfaces and interfacial defects may be magnified by subsequently deposited layers as the film stack is built, so that the top surface of the film stack may be unacceptably rough for downstream patterning processes. Further, interfacial defects within the film stack may lead to structural and/or electrical defects in the resulting integrated device.

SUMMARY OF THE DISCLOSURE

Disclosed herein are methods of forming a film stack comprising layers of silicon nitride film and silicon oxide film on a patterned semiconductor substrate in a processing chamber. The methods may include depositing a first silicon nitride film, the first silicon nitride film formed from the reaction of a nitrogen containing precursor with a first silicon containing precursor, the deposition accelerated by a plasma having a first plasma composition, substantially eliminating the first silicon containing precursor from the processing chamber, the elimination accelerated by a plasma having a second plasma composition, depositing a first silicon oxide film atop the first silicon nitride film, the first silicon oxide film formed from the reaction of a second silicon containing precursor with an oxidant, the deposition accelerated by a plasma having a third plasma composition, and substantially eliminating the oxidant from the processing chamber, the elimination accelerated by a plasma having a fourth plasma composition. Furthermore, in some embodiments, film stack forming methods may further include continuously maintaining a plasma in the processing chamber while converting the plasma having the first plasma composition into the plasma having the second plasma composition, continuously maintaining a plasma in the processing chamber while converting the plasma having the second plasma composition into the plasma having the third plasma composition, and continuously maintaining a plasma in the processing chamber while converting the plasma having the third plasma composition into the plasma having the fourth plasma composition.

Still further film stack forming methods may include continuously maintaining a plasma in the processing chamber while converting the plasma having the fourth plasma composition into a plasma having substantially the first plasma composition, depositing a second silicon nitride film atop the first silicon oxide film, the second silicon nitride film formed from the reaction of the nitrogen containing precursor with the first silicon containing precursor, the deposition accelerated by the plasma having substantially the first plasma composition, continuously maintaining a plasma in the processing chamber while converting the plasma having substantially the first plasma composition into a plasma having substantially the second plasma composition, repeating the step of substantially eliminating the first silicon containing precursor from the processing chamber, the elimination accelerated by the plasma having substantially the second plasma composition, continuously maintaining a plasma in the processing chamber while converting the plasma having substantially the second plasma composition into a plasma having substantially the third plasma composition, depositing a second silicon oxide film atop the second silicon nitride film, the second silicon oxide film formed from the reaction of the second silicon containing precursor with the oxidant, the deposition accelerated by the plasma having substantially the third plasma composition, continuously maintaining a plasma in the processing chamber while converting the plasma having substantially the third plasma composition into a plasma having substantially the fourth plasma composition, and repeating the step of substantially eliminating the oxidant from the processing chamber, the elimination accelerated by the plasma having substantially the fourth plasma composition. In certain such embodiments, the step of substantially eliminating the oxidant from the processing chamber does not include a pump-to-base of the processing chamber below a base pressure of 0.5 torr, and in certain such embodiments, the step of substantially eliminating silane from the processing chamber does not include a pump-to-base of the processing chamber below a base pressure of 0.5 torr.

In some of the methods disclosed herein, the nitrogen containing precursor used to form the first silicon nitride film may be ammonia, and the first silicon containing precursor used to form the first silicon nitride film may be silane. In some of the methods disclosed herein, the second silicon containing precursor, the silicon containing precursor which is used to form the first silicon oxide film, may be TEOS, and the oxidant used to react with the second silicon containing precursor may be oxygen. In some of the methods disclosed herein, the inert gas species used to form the second plasma composition may include argon, and the inert gas species used to form the fourth plasma composition may include argon. In some of the methods disclosed herein, the first and/or the third plasma compositions may include nitrogen.

In some of the methods disclosed herein, the elimination of the oxidant may be further accelerated by purging the processing chamber with the inert gas species, and the elimination of the second silicon containing precursor may be further accelerated by purging the processing chamber with the inert gas species. In certain such embodiments, the inert gas species of the second plasma composition may be argon, and the inert gas species of the fourth plasma composition may also be argon. In certain further embodiments, the methods may include delivering argon to the processing chamber using a dedicated process gas delivery line which is not used to deliver the first or second silicon containing precursors, the ammonia containing precursor, or the oxidant to the processing chamber.

In some of the methods disclosed herein, the plasma having the first plasma composition and the plasma having the third plasma composition may both be maintained with RF power having one or more frequencies between about 200 kHz and about 2000 kHz, and also RF power having one or more frequencies between about 13.56 MHz and about 80 MHz. In some embodiments, the plasma having the second plasma composition and the plasma having the fourth plasma composition may both be maintained with RF power having one or more frequencies between about 13.56 MHz and about 80 MHz.

Also disclosed herein are process station apparatuses for forming a film stack comprising layers of silicon nitride film and silicon oxide film on a patterned semiconductor substrate. The process station apparatuses may include a processing chamber and a substrate holder within the processing chamber, one or more gas delivery lines configured to deliver a nitrogen containing precursor, a first silicon containing precursor, a second silicon containing precursor, an oxidant, and an inert gas species to the processing chamber, one or more RF generators configured to excite plasmas within the processing chamber, and a system controller with machine-readable media having instructions for carrying out various process operations.

In some process station apparatuses, the machine readable media of the system controller may include instructions for operating the one or more gas delivery lines to deliver the nitrogen containing precursor and the first silicon containing precursor to the processing chamber, instructions for operating the one or more RF generators to generate a plasma having a first plasma composition which accelerates the deposition of a silicon nitride film formed from the reaction of the nitrogen containing precursor with the first silicon containing precursor, instructions for operating the one or more gas delivery lines to deliver a first volume of an inert gas species to the processing chamber, and instructions for operating the one or more RF generators to excite and/or ionize the inert gas species, thereby generating a plasma having a second plasma composition which accelerates the substantial elimination of the first silicon containing precursor from the processing chamber. In some embodiments, the instructions for operating the one or more gas delivery lines to deliver the first volume of the inert gas species may include instructions for performing an inert purge of the processing chamber.

In some process station apparatuses, the machine readable media of the system controller may include instructions for operating the one or more gas delivery lines to deliver the second silicon containing precursor and the oxidant to the processing chamber, instructions for operating the one or more RF generators to generate a plasma having a third plasma composition which accelerates the deposition of a silicon oxide film formed from the reaction of the second silicon containing precursor with the oxidant, instructions for operating the one or more gas delivery lines to deliver a second volume of the inert gas species to the processing chamber, and instructions for operating the one or more RF generators to excite and/or ionize the inert gas species thereby generating a plasma having a fourth plasma composition which accelerates the substantial elimination of the oxidant from the processing chamber. In some embodiments, the instructions for operating the one or more gas delivery lines to deliver the second volume of the inert gas species may include instructions for performing an inert purge of the processing chamber.

In some process station apparatuses having a controller and machine readable media with instructions for generating plasmas having the first, second, third, and fourth compositions, generating the plasma having the second plasma composition comprises continuously maintaining a plasma in the processing chamber while converting the plasma having the first plasma composition into the plasma having the second plasma composition, generating the plasma having the third plasma composition comprises continuously maintaining a plasma in the processing chamber while converting the plasma having the second plasma composition into the plasma having the third plasma composition, and generating the plasma having the fourth plasma composition comprises continuously maintaining a plasma in the processing chamber while converting the plasma having the third plasma composition into the plasma having the fourth plasma composition.

Various substances may serve as reactants and precursors for forming the film stacks deposited by the disclosed process station apparatuses. In some embodiments, the nitrogen containing precursor may be ammonia. In some embodiments, the first silicon containing precursor may be silane. In some embodiments, the second silicon containing precursor may be TEOS. In some embodiments, the oxidant may be oxygen.

Various configurations of gas delivery lines are possible depending on the process station apparatus. In some embodiments, the processing station apparatus may have one or more gas delivery lines including a first gas delivery line configured to deliver the first silicon containing precursor in a first carrier gas to the processing chamber. In some embodiments, the processing station apparatus may have a second gas delivery line configured to deliver the nitrogen containing precursor in a second carrier gas to the processing chamber. In some embodiments, the processing station apparatus may have a third gas delivery line configured to deliver the second silicon containing precursor in a third carrier gas and the oxidant in the third carrier gas to the processing chamber. In some embodiments, the processing station apparatus may have a fourth gas delivery line configured to deliver the inert gas species to the processing chamber.

Plasmas generated in accordance with instructions from the machine readable media of the process controller may have a variety of compositions. In some embodiments, the first plasma composition may include excited and/or ionized molecules of the first and/or the second carrier gases. In some embodiments, the third plasma composition may include excited and/or ionized molecules of the third carrier gas. In some embodiments, the first, second, and third carrier gases are nitrogen.

Some process station apparatuses disclosed herein may include a showerhead positioned above the substrate holder in the processing chamber. In some embodiments, the showerhead may be configured to disperse the first silicon containing precursor delivered to the processing chamber from the first gas delivery line, disperse the nitrogen containing precursor delivered to the processing chamber from the second gas delivery line, and disperse the second silicon containing precursor and the oxidant delivered to the processing chamber from the third gas delivery line. In some embodiments, the inert gas species is argon.

Various instructions residing on the machine-readable media of the system controller operate the one or more RF generators to generate plasmas of various compositions. In some embodiments, the instructions for operating the one or more RF generators to generate the plasma having the first plasma composition may include instructions to emit RF power having one or more frequencies between about 200 kHz and about 2000 kHz and one or more frequencies between about 13.56 MHz and about 80 MHz. In some embodiments, the instructions for operating the one or more RF generators to generate the plasma having the third plasma composition may include instructions to emit RF power having one or more frequencies between about 200 kHz and about 2000 kHz and one or more frequencies between about 13.56 MHz and about 80 MHz. In some embodiments, the instructions for operating the one or more RF generators to generate the plasma having the second plasma composition may include instructions to emit RF power having one or more frequencies between about 13.56 MHz and about 80 MHz. In some embodiments, the instructions for operating the one or more RF generators to generate the plasma having the fourth plasma composition may include instructions to emit RF power having one or more frequencies between about 13.56 MHz and about 80 MHz.

DETAILED DESCRIPTION

Figure 1:
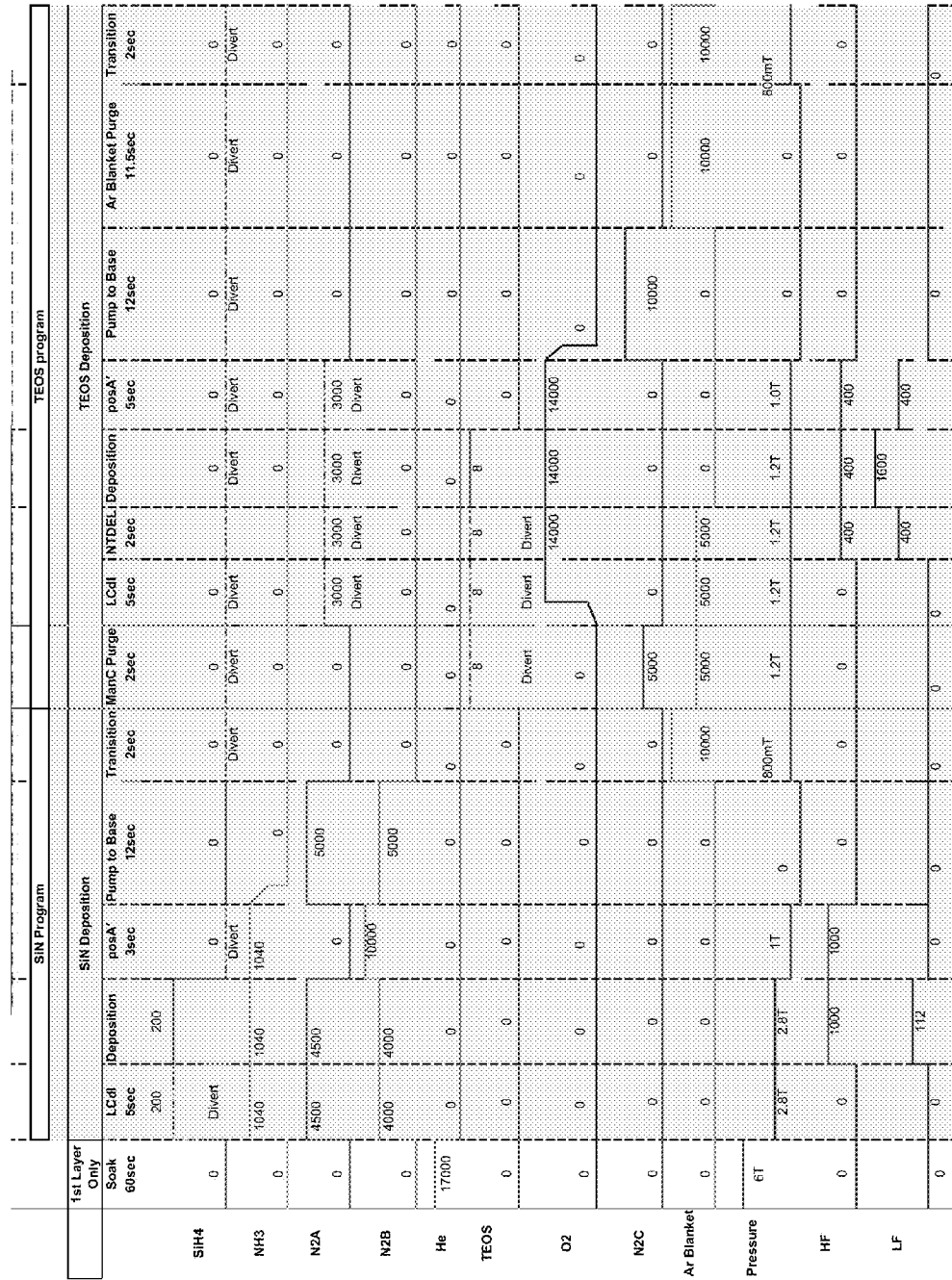
FIG. 1 is a timing schematic of a plasma enhanced chemical vapor deposition (PECVD) based process for generating multi-layer film stacks containing alternating layers of silicon nitride film and silicon oxide film, wherein the process employs a pump-to-base step.

Some memory devices, such as NAND flash memory, are arranged in two-dimensional arrays. Because such memory devices are limited to a planar arrangement, die size and memory density parameters may constrain the total memory capacity of the device. In turn, moving to larger die sizes to expand memory capacity may comparatively increase the cost of the memory device, which may delay adoption of larger capacity memory devices. Recently, some approaches for arranging memory gates into three-dimensional (3D) arrays have been proposed. Some of these approaches incorporate transistors formed by patterning stacks of alternating film composition.

Patterning stacks of films having alternating compositions may be difficult for a variety of reasons. For example, bumps, ripples, undulations, and surface irregularities can be caused by particles which become incorporated into the film as it is being deposited. In some cases, particle defects may be generated from the interaction of incompatible processes gases during deposition, such as during the in-situ transition from one film deposition process to another (although particle defects may also be generated during wafer handling operations in ex-situ deposition processes). As the film stack is deposited and built, these bumps, ripples, undulations, and surface irregularities may become magnified in size as subsequent layers are deposited atop of them, potentially leading to focus, exposure, and etch problems in downstream patterning operations. Accordingly, it is desirable for each layer to be as smooth as feasible.

Accordingly, various embodiments are disclosed herein which relate to depositing film layers of differing composition to form a multilayer film stack. For instance, embodiments are described below which relate to ultra-smooth film deposition chemistries and processes which may result in ultra-smooth films. In some embodiments, a plasma enhanced chemical vapor deposition (PECVD) process is used to deposit one or more layers of smooth film. Embodiments are also described below which related to tools and apparatuses for accomplishing smooth multilayer film deposition.

As indicated above, one obstacle to the formation of a stack of multiple smooth film layers is the potential particle contamination which may occur during deposition. For instance, deposition of sequential layers having differing chemical composition will typically require a switch in process chemistries within the processing chamber, because different types of films are formed from different types of film precursors. Switching process chemistries may oftentimes lead to particle contamination because film precursors and reactants from the initial process chemistry may not be compatible with film precursors and reactants from the subsequent process chemistry—e.g. they may react with one another forming particles which adhere to the film being deposited forming surface irregularities.

One specific example of a film stack having alternating layers of varying compositions, an example which is particularly important in the fabrication of integrated memory devices, is a film stack having alternating layers of silicon nitride and silicon oxide. In some embodiments, the layers of silicon nitride may be formed in a PECVD process from silane and ammonia precursors in the presence of nitrogen gas, and the layers of silicon oxide may be formed in a PECVD process from tetraethyl orthosilicate (TEOS) precursor in the presence of an oxidant such as $O_2$. However, whereas a mixture of TEOS and $O_2$ react in the presence of a suitable plasma to deposit a smooth film of silicon oxide, a mixture of silane and $O_2$ is also reactive and results in the formation of silicon oxide particles which contaminate the films being deposited and prevent the formation of smooth film layers as discussed above. Accordingly, because of the reactive nature of $O_2$ and silane, care must be taken in the deposition of alternating silicon nitride and silicon oxide layers to avoid the simultaneous presence of silane and oxygen in the processing chamber.

In principle, a process which deposits alternating layers of silicon nitride and silicon oxide may avoid silane contact with oxygen by performing the silicon nitride and silicon oxide depositions ex situ—i.e. in separate processing chambers. However, the intervening vacuum break when transferring between chambers may itself introduce particle contamination. Furthermore, this process is extremely time-consuming.

Figure 6:
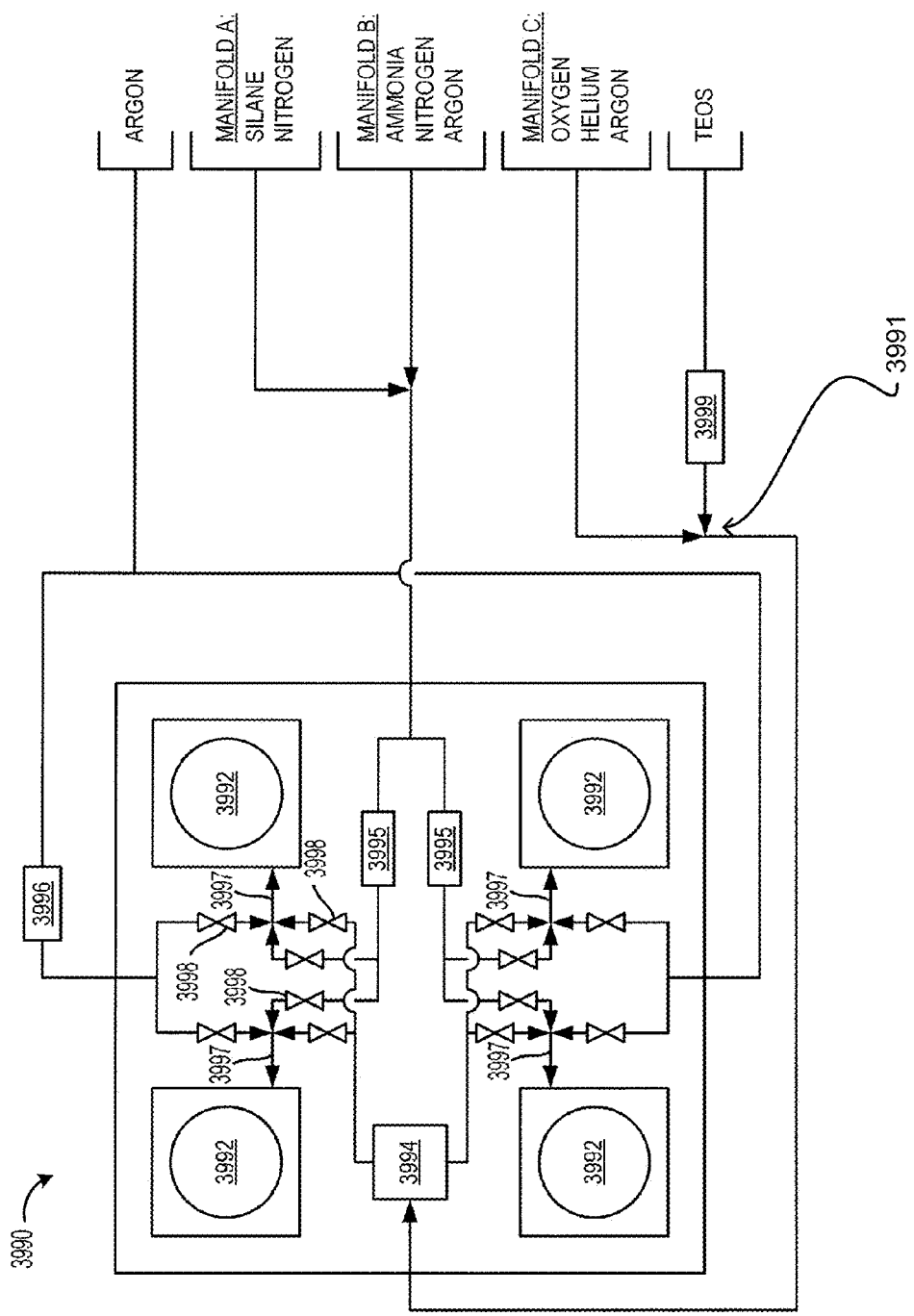
FIG. 6 schematically illustrates another example of a multi-station process tool according to an embodiment of the present disclosure.

A better option, which is effective in some embodiments at reducing defect generation, is to deposit alternating layers in-situ, using a single processing chamber to deposit both the silicon nitride and silicon oxide films, and to transition between deposition processes by pumping the processing chamber to a base pressure (pump-to-base) and/or by purging the processing chamber with an inert gas in order to remove any remaining precursors or reactants. Such a procedure employing a pump-to-base and inert purge is illustrated in FIG. 1 which is described in detail below. In some embodiments, the inert purge gas is supplied through its own dedicated gas delivery lines, which may be beneficial because in some circumstances significant degassing may occur in the lines which carry the film precursors and reactants. Such a setup is schematically illustrated in FIG. 6 which is described below.

Nevertheless, despite the feasibility of utilizing a pump-to-base and inert purge to transition between sequential deposition processes in-situ, in some embodiments this procedure is still time consuming, and it can significantly slow wafer processing throughput. In certain such cases, this is due to the large upstream and downstream volumes of precursors and reactants in the gas delivery lines which, even while using a dedicated inert gas delivery system to provide the purge gas, may necessitate long pump-to-base and purge times in order to sufficiently clear incompatible precursors and reactants. Moreover, there may be particular regions of the processing chamber or the precursor/reactant delivery lines and manifolds which exhibit stagnant flow characteristics resulting in somewhat trapped volumes of precursors/reactants, again, requiring long pump-to-base and purge times. Thus, a pump-to-base coupled with inert purge procedure used to transition between different deposition processes may be time consuming, and there are potential benefits to be realized by decreasing the amount of time it takes to eliminate incompatible reactants from the processing chamber.

Accordingly, disclosed herein are various methods and apparatuses for reducing the duration of the transition period between subsequent deposition operations. In particular, disclosed herein are various continuous plasma on (CPO) methods and apparatuses which involve maintaining a plasma in the processing chamber during the transition in order to accelerate the elimination of reactants and precursors leftover from the preceding deposition processes. In particular embodiments, a continuous plasma on process is used to speed the transition between silicon nitride deposition and silicon oxide deposition, and vice versa. Without being limited to a particular theory, it is thought that the presence of a plasma in the processing chamber helps to drive the degradation of residual oxygen and/or silane, thereby decreasing the time required for a successful inert purge, and thus decreasing particle generation and improving the defectivity of the deposited $SiN/SiO_x$ film stack.

Maintenance of a plasma during the transition between deposition processes may pose certain challenges, however. In particular, a minimum gas pressure must be present in the processing chamber at all times in order to support the plasma precluding simultaneous use of a pump-to-base to remove reactants. One option for supplying the plasma-supporting gas is to take advantage of the reactant precursor delivery lines and carrier gases already employed to deliver reactants, and to simply divert the reactants from the carrier gas flow. While in some circumstances this might be possible for some combinations of reactants, and while this strategy is appealing for its simplicity, the methodology generally suffers from the likelihood of prolonged degassing of reactants from the delivery lines, which may lead to either substantially increased purge times or greater particle contamination during subsequent deposition, or both.

Accordingly, in certain embodiments, the better practice is to use a dedicated gas delivery line to supply the plasma-supporting gas, avoiding the aforementioned degassing and contamination—despite any additional cost and complexity of this setup. In some embodiments, the plasma-supporting gas may be an inert gas, and may be simultaneously employed as a purge gas—as long as the pressure and flow parameters for the purge are consistent with supporting the plasma. Such a scheme is illustrated and described in detail in FIG. 2 below. In some embodiments, the inert plasma-supporting purge gas may be argon. However, as will be appreciated by one having ordinary skill in the art, other inert gases may also be suitable for purging the processing chamber while supporting a plasma.

Figure 2:
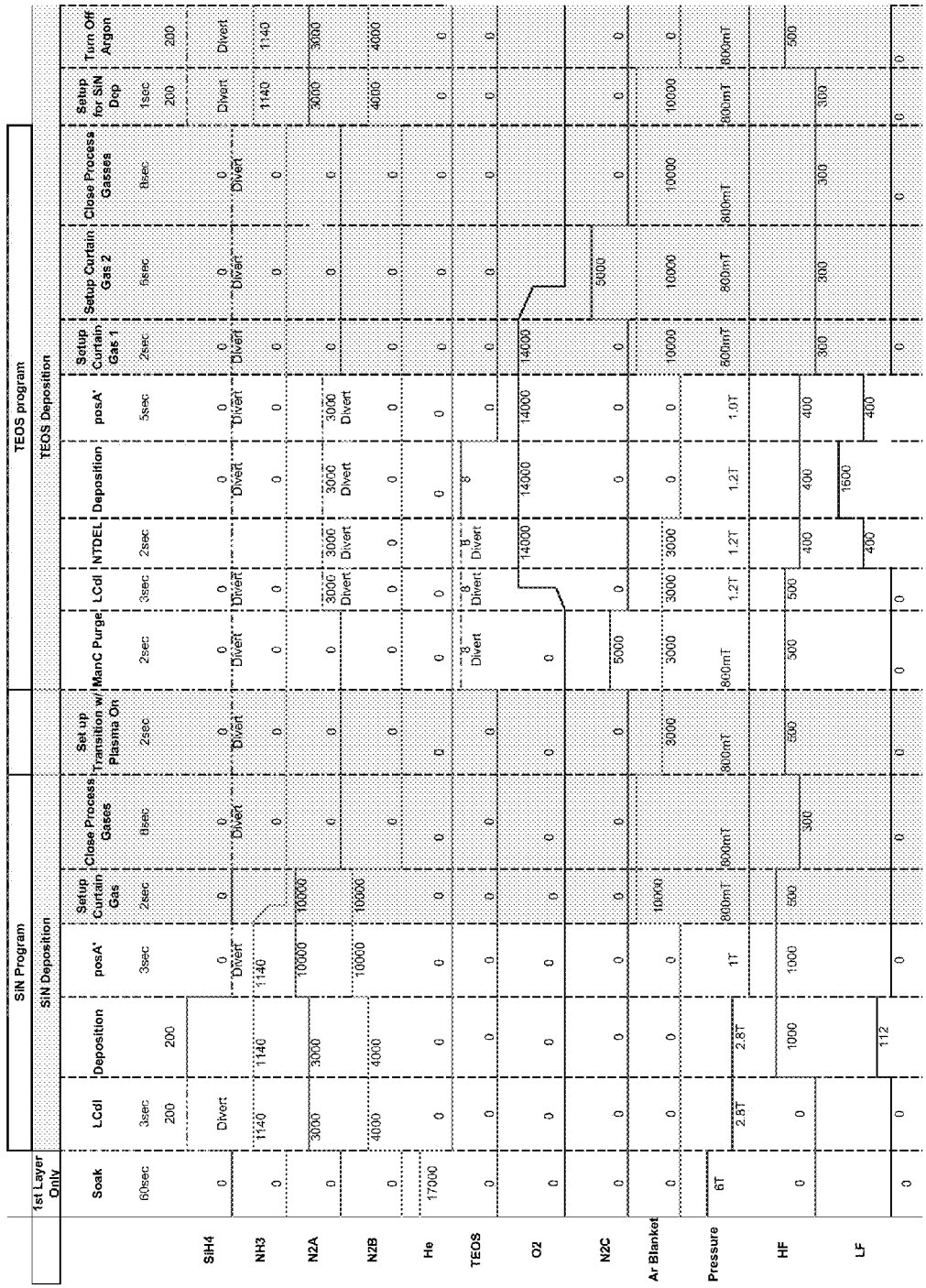
FIG. 2 is a timing schematic of a PECVD based process for generating multi-layer film stacks containing alternating layers of silicon nitride film and silicon oxide film, wherein a plasma is continuously on/maintained throughout the process.

FIG. 1 and FIG. 2 illustrate detailed timing diagrams for two sample embodiment processes for generating multi-layer film stacks containing alternating layers of silicon nitride film and silicon oxide film. While these timing diagrams are described in great depth with respect to these specific embodiments, it should be understood that this detailed description is intended to be illustrative and not restrictive of the various inventive concepts disclosed herein.

In the description below, the process depicted in FIG. 1 will be referred to as the "reference pump-to-base" (PTB) process, and the process depicted in FIG. 2 will be referred to as the "continuous plasma on" (CPO) process. Note that these processes have various steps in common, and that they are illustrated in FIGS. 1 and 2 in a similar schematic fashion. Accordingly, to the extent it is feasible, the PTB and CPO processes depicted in these two figures will be described concurrently, with their differences pointed out with reference to FIGS. 1 and 2, individually. As indicated by referring to the FIG. 1 process as a PTB process and to the FIG. 2 process as a CPO process, a significant difference between the two is that the transition between silicon nitride film and silicon oxide film deposition depicted in the former involves a pump-to-base step where no plasma is present in the processing chamber, whereas in the latter CPO process, the plasma remains continuously on during the transition from silicon nitride to silicon oxide deposition. And, the same holds for the reverse transitions as well (i.e., silicon oxide to silicon nitride).

Accordingly, referring to both FIGS. 1 and 2, both the reference PTB process and the CPO process begin with a 60 second soak step wherein helium is flowed through the processing chamber to purge any atmospheric gases, volatile species remaining adsorbed on the substrate or processing chamber surfaces, etc. As indicated in FIGS. 1 and 2, in these embodiments, the soak step is only performed before deposition of the first film layer of silicon nitride. (Of course, if the first deposited layer were a silicon oxide layer, the soak step would precede this deposition.) Generally, repeating the soak step prior to depositing layers other than the first layer is unnecessary and simply slows processing.

After the soak step, the silicon nitride (SiN) deposition phase of the stack-building process is initiated. In both of these embodiments, the silicon nitride precursors are ammonia ($NH_3$) and silane ($SiH_4$), and each of these reactants is supplied by its own gas delivery line and manifold ("manifold A" and "manifold B") to the processing chamber via nitrogen ($N_2$) carrier gas (designated N2A and N2B in FIGS. 1 and 2). The first step of the silicon nitride deposition phase in both the reference PTB and CPO processes is a line charge delay step ("LCdl" in FIGS. 1 and 2) wherein the nitrogen carrier gas flows from both manifolds into the processing chamber (indicated by the "N2A" and "N2B" flow line traces in FIGS. 1 and 2). As indicated in the figures, ammonia accompanies the nitrogen flow from manifold B (N2B) and is carried into the processing chamber, but silane is diverted from the nitrogen flowing through manifold A (N2A) so that, at this point, it is not carried into the processing chamber. Without a flow of silane, reaction with ammonia to form silicon nitride is delayed, the purpose of which is to establish a steady flow of nitrogen carrier gas and charge the gas delivery lines supplying manifolds A and B prior to initiation of the actual silicon nitride deposition reaction.

Thus, actual silicon nitride deposition is initiated when silane is no longer diverted from the nitrogen carrier gas flow through manifold A, and silane and ammonia are allowed to react in the processing chamber—i.e. the step labeled "deposition" in FIGS. 1 and 2. Flow of ammonia during this "deposition" step remains the same as in the preceding "LCdl" step. However, just moments before the silane is introduced, high frequency (HF) and low frequency (LF) radio-frequency (RF) power is switched on to generate a plasma in the processing chamber. Since the plasma functions here to enhance and accelerate the silicon nitride deposition reaction between ammonia and silane, the deposition reaction here may be referred to as a plasma-enhanced chemical vapor deposition (PECVD) process. Thus, this silicon nitride "deposition" step results in a first silicon nitride film being formed from ammonia and silane precursors, in a deposition process accelerated by a plasma having a plasma composition which includes nitrogen gas.

The ammonia/silane reaction is terminated when silane is again diverted in the so-labeled "posA'" step—see FIGS. 1 and 2. Here, there is a slight difference between the processes illustrated in FIGS. 1 and 2 in that the nitrogen flowing through manifold A is switched off in the reference PTB process (FIG. 1), while it remains flowing (albeit with silane diverted) in the CPO process (FIG. 2). In both processes, in addition to diverting silane, the low-frequency (LF) RF field is switched off—which in general, when present, acts to drive the deposition reaction. However, despite extinguishing the LF RF field, the high-frequency (HF) RF field remains switched on, which acts to accelerate the elimination (e.g., driving decomposition/degassing) of any remaining silane in the processing chamber. Note that other than nitrogen flow through manifold A in the "posA" step (and the numerical values for various flow rates indicated in FIGS. 1 and 2, which differ slightly in some cases), up to this point in the silicon nitride deposition phase, the reference PTB and the CPO processes are substantially similar.

After the "posA'" step, however, the transition phase to silicon oxide deposition begins and, at this point, the processes diverge, with the reference PTB process beginning the transition with a pump-to-base lasting approximately 12 seconds. FIG. 1 indicates that a nitrogen flow is maintained through both manifolds during this step, with ammonia flow trailing off, and that both the high-frequency and low-frequency RF fields are switched off. Following the pump-to-base, flow of nitrogen is extinguished and replaced with an argon blanket flowing from a separate delivery line in a further transition step lasting approximately 2 seconds.

In contrast, there is no time-consuming pump-to-base step in the CPO process exhibited in FIG. 2. Instead, an argon blanket is delivered to the processing chamber with its own dedicated gas delivery line accompanied by the continued delivery of nitrogen from both manifolds A and B in a "setup curtain gas" step wherein the high-frequency RF field remains on, thus maintaining the plasma present during silicon nitride deposition. The next two steps convert the plasma to a purely argon-based plasma. First, in the "close process gases" step, nitrogen flow is shut off and high-frequency (HF) RF power is decreased to effect a conversion to a soft argon plasma. Second, in the "set up transition with plasma on" step, argon flow is reduced while HF power is increased to compensate. As a result, during these latter two steps, a purely argon-based plasma is present in the processing chamber. Note that this argon-based plasma was essentially converted from the previous nitrogen-based plasma all the while a maintaining the plasma in the processing chamber throughout the conversion. The effect of the argon plasma is to accelerate the elimination (via decomposition, and/or degassing, etc.) of residual reactants in the processing chamber. As described above, this reduces the likelihood of forming substrate contaminating particles. Thus, at this point in the CPO process, silane has been substantially eliminated from the processing chamber, and the elimination has been accelerated by a plasma with a plasma composition including argon. Note that the 3 transition-related steps in the CPO process are cumulatively accomplished in 2 seconds less than the 2 transition-related steps in the reference PTB process. Furthermore, as the experiments described below illustrate, stacks produced in the CPO process seem to have less particle contamination than stacks produced using the reference PTB process, despite the fact that the CPO improves substrate processing throughput.

With silicon nitride deposition concluded, and lingering reactants substantially eliminated by the foregoing transition steps, the processing chamber is prepped to begin silicon oxide deposition. In both the reference PTB and CPO processes of FIGS. 1 and 2, the layer of silicon oxide film to be deposited atop the silicon nitride film layer is formed from oxygen and TEOS precursors, and in both processes, the TEOS precursors are carried to the processing chamber via a nitrogen flow diverted from manifold A to the gas delivery line fluidically coupled to manifold C. Oxygen is also supplied to the processing chamber through the delivery line fluidically coupled to manifold C, but due to the possibility of contamination from prior process steps, manifold C and its associated gas delivery line are purged with argon and nitrogen in a "manC purge" step prior to supplying oxygen. After purging manifold C, in a line charge delay step (once again designated as "LCdl"), the prior nitrogen flow through manifold C (done in "manC purge") is switched off, and a new nitrogen flow is diverted from manifold A to manifold C—at this point with TEOS temporarily diverted from this flow. In addition, at some point during "LCdl" an oxygen flow through manifold C is activated and ramped up.

A blanket of argon has continued to flow through both steps, and the argon continues to flow through the subsequent "NTDEL" step where it is struck with low-frequency RF power switched on during the "NTDEL" step. Here, once again the processes diverge in the sense that in the CPO process, the plasma has remained on since silicon nitride deposition and throughout the transition, maintained by high-frequency power, whereas in the reference PTB process, striking the argon with low-frequency power is accompanied by activation with high-frequency power which in combination create the plasma anew. Note that while high-frequency power is adequate to maintain an argon plasma, an argon plasma maintained by low-frequency power tends to more strongly enhance chemical vapor deposition rates. Hence, the high-frequency plasma already present in the CPO process is struck by low-frequency radiation prior to commencing silicon oxide deposition. With the lines charged, oxygen flowing, and low-frequency radiation supporting a plasma, TEOS is ready to be diverted back into the nitrogen flow to the chamber in order to initiate silicon oxide deposition. As the TEOS is introduced, flow of argon into the chamber is stopped and the power level of the low-frequency radiation is increased, the plasma now maintained by the flow of nitrogen. Thus, a layer of silicon oxide film formed from oxygen and TEOS precursors is deposited in a process accelerated by a plasma having a nitrogen-based composition. Following silicon oxide deposition, nitrogen and TEOS flow is switched off in a "posA'" step which also involves decreasing low-frequency power.

Thus, as with the silicon nitride deposition phase, the silicon oxide deposition phase up through the "posA'" step is substantially the same in both the reference PTB and CPO processes, as can be seen from FIGS. 1 and 2. However, the steps involved in transitioning back to silicon nitride deposition are quite different between the two embodiment processes.

In the reference PTB process, the "posA'" step is followed by a 12 second pump-to-base accompanied by high flow of nitrogen from manifold C, and this step is then followed by an 11.5 second argon purge with continued application of base pressure. Note that in both steps RF power remains off and it stays off though the 2 second "transition" step which follows wherein the flow of argon continues, with pressure set to wafer transfer pressure (0.5 to 0.8 torr). The combination of these three steps does generally serve to substantially eliminate remaining TEOS and oxygen in the processing chamber. As described above, oxygen reacts strongly with the silane used in the silicon nitride deposition phase to generate silicon oxide particles, and so it is advantageous to remove as much oxygen as possible—before the next silicon nitride deposition phase begins—in order to minimize particle generation and substrate contamination. Nevertheless, processing speed is also important, and the combination of these three steps constitute a 25.5 second delay in returning to silicon nitride deposition.

In the CPO process, the transition after silicon oxide deposition involves 4 steps—not including the last step of turning off argon—however, the total time for the 4 steps is 17 seconds, 8.5 seconds less than required in the reference PTB process. During the 4 steps, high-frequency RF power remains on throughout, in order to keep a plasma continuously maintained in the processing chamber, accelerating elimination of oxygen and TEOS. The plasma changes through the 4 steps, as it is converted from having one composition to another based on different gases, but note however that there is no pump-to-base as its use is inconsistent with maintaining sufficient gas pressure to support the plasma.

Initially, in "setup curtain gas 1," a blanket of argon flow is added to the oxygen still flowing into the chamber. Next, in "setup curtain gas 2," a nitrogen flow from manifold C is initiated and maintained, and oxygen flow is curtailed and eventually terminated. Then, in "close process gasses," the nitrogen flow from manifold C is switched off while argon continues to flow. Finally, in the last step, "setup for SiN deposition," nitrogen is flowed into the chamber through manifolds A and B. Ammonia is carried by the nitrogen through manifold B, but silane is diverted so that silicon nitride deposition is not yet initiated. Finally, after these 4 steps, the argon flow is terminated and, at this point, the chamber is prepped and ready to begin another round of silicon nitride deposition. Once again, a key feature of this CPO embodiment is that the plasma remains on throughout the transition from silicon nitride to silicon oxide deposition, promoting and accelerating the decomposition, degassing, and generally the elimination of oxygen and TEOS from the processing chamber, thereby reducing the amount of time required in the transition and the degree of particle contamination in the deposited multilayer films.

Of course, the entire sequence of steps, the silicon nitride deposition cycle and the silicon oxide deposition cycle, may be repeated as many times as desired to form multi-layered film stacks having alternating layers of silicon nitride and silicon oxide films. Furthermore, the first, or bottommost film layer is not necessarily silicon nitride. In some embodiments, a film of silicon oxide is the first deposited layer, followed by a layer of silicon nitride. In certain such embodiments, the 60 second soak step discussed above as preceding deposition of the first silicon nitride layer, may be used to prep the substrate and processing chamber prior to depositing the first silicon oxide layer. Since the process timing schematics of FIG. 1 and FIG. 2 may be cycled through multiple times to deposit multiple alternating silicon nitride and silicon oxide layers, one of ordinary skill in the art should readily appreciate how to adapt them to beginning the stack formation with a silicon nitride layer. In any event, the reduced particle contamination in these multi-layered silicon nitride/oxide films versus those deposited using the reference PTB process is illustrated in detail below.

Once again, in some embodiments, important elements of the CPO deposition process include consuming or eliminating lingering reactants from a previous deposition step by generating a plasma in the processing chamber through application of low-power, high-frequency RF radiation to an inert gas flowed at low pressure. In some embodiments, the inert plasma gas may also be used to perform an inert purge of the processing chamber. Simultaneously combining the purge with plasma generation may, in some embodiments, speed transition times between deposition steps. In some embodiments, an argon blanket is used for plasma generation as well as to purge the processing chamber.

The methods described herein may be performed by any suitable substrate processing apparatus. A suitable apparatus includes hardware for accomplishing the process operations and a system controller having instructions for controlling process operations in accordance with the present disclosure.

The system controller will typically include one or more memory devices and one or more processors configured to execute instructions for controlling process operations so that the apparatus will perform a method in accordance with the present disclosure. For example, in some embodiments, the system controller may operate various gas delivery lines, valves, manifolds, temperature controllers, plasma controllers, RF generators, pressure controllers, etc. to adjust process conditions within the substrate processing apparatus. In some embodiments, machine-readable media containing instructions for controlling process operations in accordance with the present disclosure may be coupled to the system controller or may comprise the system controller.

Figure 3:
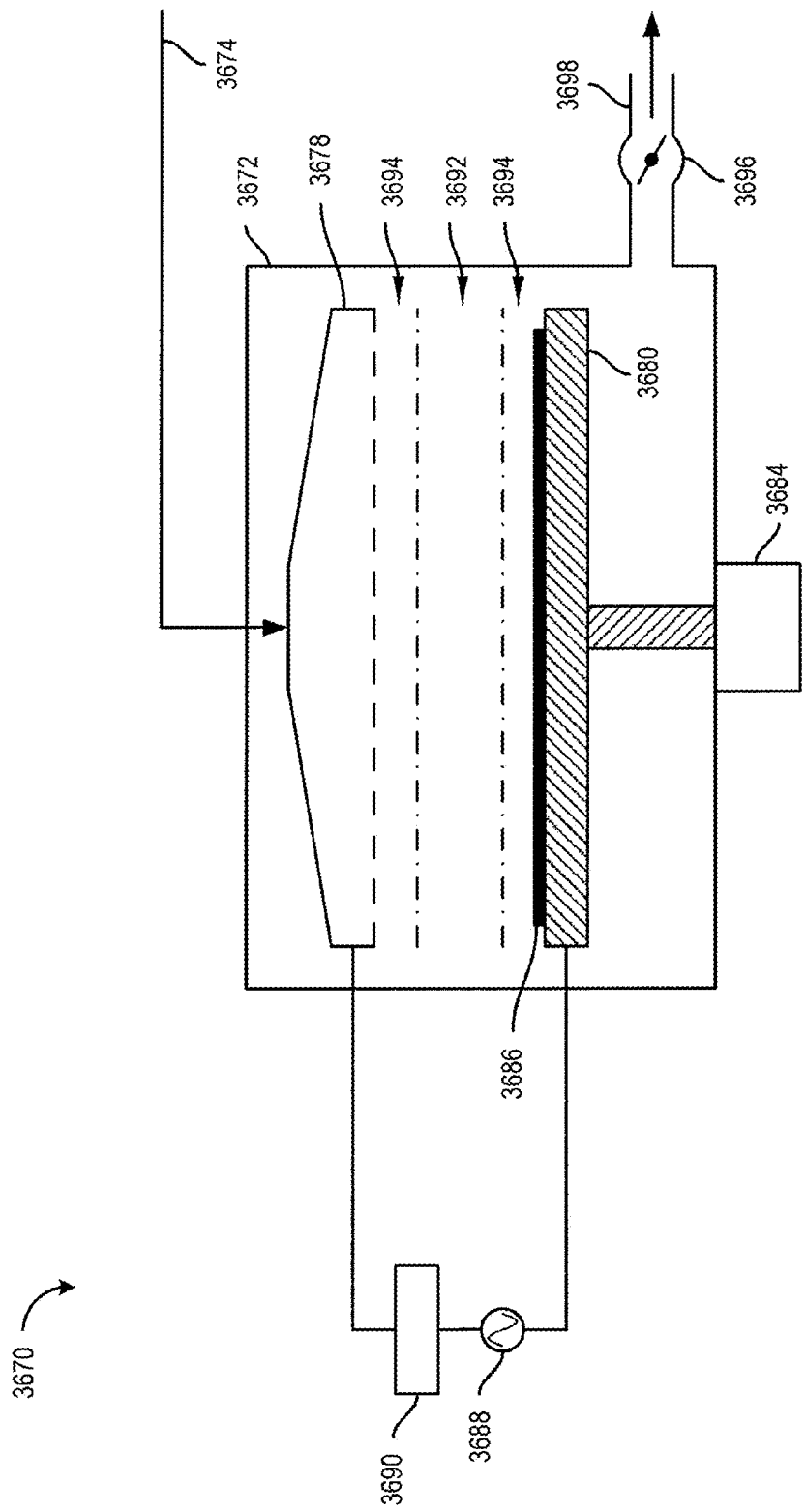
FIG. 3 schematically illustrates an example of a process station according to an embodiment of the present disclosure.

For example, FIG. 3 schematically shows an example embodiment of a process station 3600. For simplicity, process station 3600 is depicted as a standalone process station having a processing chamber 3672 for maintaining a low-pressure environment. However, it will be appreciated that a plurality of process stations 3600 may be included in a common low-pressure process tool environment. Process station 3600 includes a process gas delivery line 3674 for providing process gases, such as inert gases, precursors, reactants, and treatment reactants, for delivery to process station 3600. In the example shown in FIG. 3, a showerhead 3678 is included to distribute process gases within process station 3600. Substrate 3686 is located beneath showerhead 3678, and is shown resting on a substrate holder 3680 supported by a pedestal 3682. In some embodiments, pedestal 3682 may be configured to rotate about a vertical axis. Additionally or alternatively, pedestal 3682 may be configured to translate horizontally and/or vertically.

Figure 4:
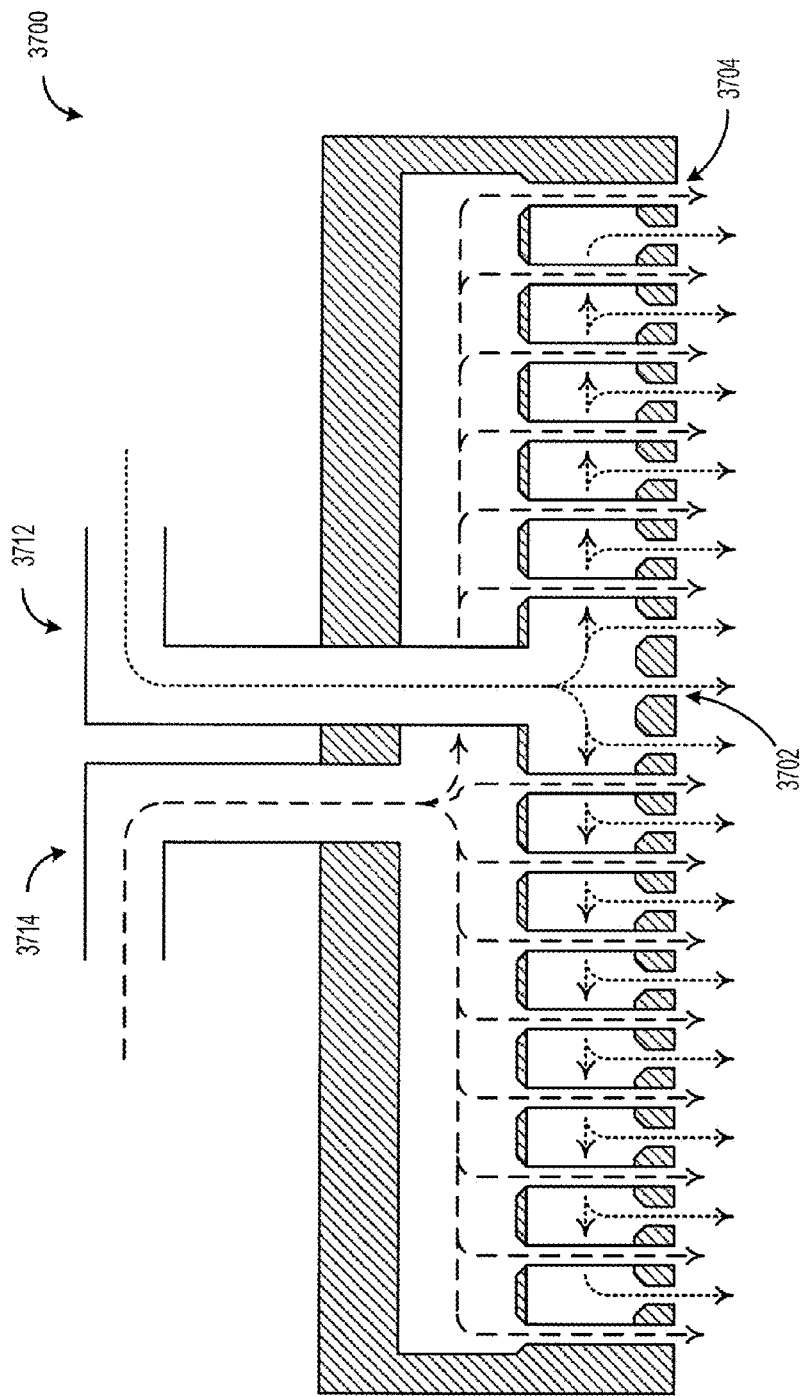
FIG. 4 schematically illustrates an example of a dual-plenum showerhead according to an embodiment of the present disclosure.

In some embodiments, showerhead 3678 may be a dual-plenum or multi-plenum showerhead. For example, FIG. 4 schematically shows an embodiment of a dual-plenum showerhead 3700. A first set of holes 3702 receives gas from a first process gas delivery line 3712 and a second set of holes 3704 receives gas from a second process gas delivery line 3714. Such physical isolation of process gases may provide an approach to reducing small particle generation from reaction between incompatible process gases in process gas delivery plumbing upstream of showerhead 3700. Any suitable segregation scheme may be employed. For example, in one scenario, holes 3702 may be dedicated to a silicon dioxide film deposition process while holes 3704 may be dedicated to a silicon nitride film deposition process. In another scenario, holes 3704 may be dedicated to oxidizing reactants while holes 3704 may be dedicated to reducing reactants. While the example shown in FIG. 3 is a dual-plenum showerhead, it will be appreciated that, in some embodiments, a showerhead may be a multi-plenum showerhead having three or more sets of holes.

Showerhead 3678 and holder 3680 electrically communicate with RF power supply 3688 and matching network 3690 for powering a plasma 3692. Plasma 3692 may be contained by a plasma sheath 3694 located adjacent to showerhead 3678 and holder 3680. While FIG. 3 depicts a capacitively-coupled plasma, plasma 3692 may be generated by any suitable plasma source. In one non-limiting example, plasma 3692 may include a parallel plate plasma source.

In the embodiment shown in FIG. 3, RF power supply and generator 3688 may provide RF power of any suitable frequency. In some embodiments, RF power supply and generator 3688 may be configured to independently generate and control high- and low-frequency RF power. Examples of low-frequency RF power produced by an RF power supply and generator may include, but are not limited to, frequencies between 200 kHz and 2000 kHz. Example high-frequency RF power may include, but are not limited to, frequencies between 13.56 MHz and 80 MHz. Likewise, RF power supply and generator 3688 and matching network 3690 may be operated at any suitable power to form plasma 3692. Examples of suitable powers include, but are not limited to, powers between 250 W and 5000 W for a high-frequency plasma and powers between 0 W and 2500 W for a low-frequency plasma for a four-station multi-process tool including four 15-inch showerheads. RF power supply and generator 3688 may be operated at any suitable duty cycle. Examples of suitable duty cycles include, but are not limited to, duty cycles of between 5% and 90%.

Returning to FIG. 3, in some embodiments, holder 3680 may be temperature controlled via heater 3684. Further, in some embodiments, pressure control for process station 3600 may be provided by butterfly valve 3696 or by any other suitable pressure control device. As shown in FIG. 3, butterfly valve 3696 throttles a vacuum provided by a vacuum pump (not shown) fluidly coupled to process station exhaust line 3698. However, in some embodiments, pressure control of process station 3600 may also be adjusted by varying a flow rate of one or more gases introduced to process station 3600. It will be appreciated that control of one or more process parameters may be provided locally (e.g., RF power may be controlled by a plasma controller communicating with RF power supply 3688, process station pressure may be controlled by a valve controller communicating with butterfly valve 3696 or with gas metering valves or flow controllers included coupled with process gas delivery line 3674, etc.) or under partial or total control provided by a system controller (described in more detail below) communicating with process station 3600 without departing from the scope of the present disclosure.

As described above, one or more PECVD process stations may be included in a multi-station processing tool. In some embodiments of a multi-station process tool, control and/or supply of various process inputs (e.g., process gases, plasma power, gases for plasma generation, reactants, film precursors, heater power, etc.) may be distributed from shared sources to a plurality of process stations included in the process tool. For example, in some embodiments, a shared plasma generator may supply plasma power to two or more process stations. In another example, a shared gas distribution manifold may supply process gases to two or more process stations. Some non-limiting example embodiments of multi-station processing tools are described below.

Figure 5:
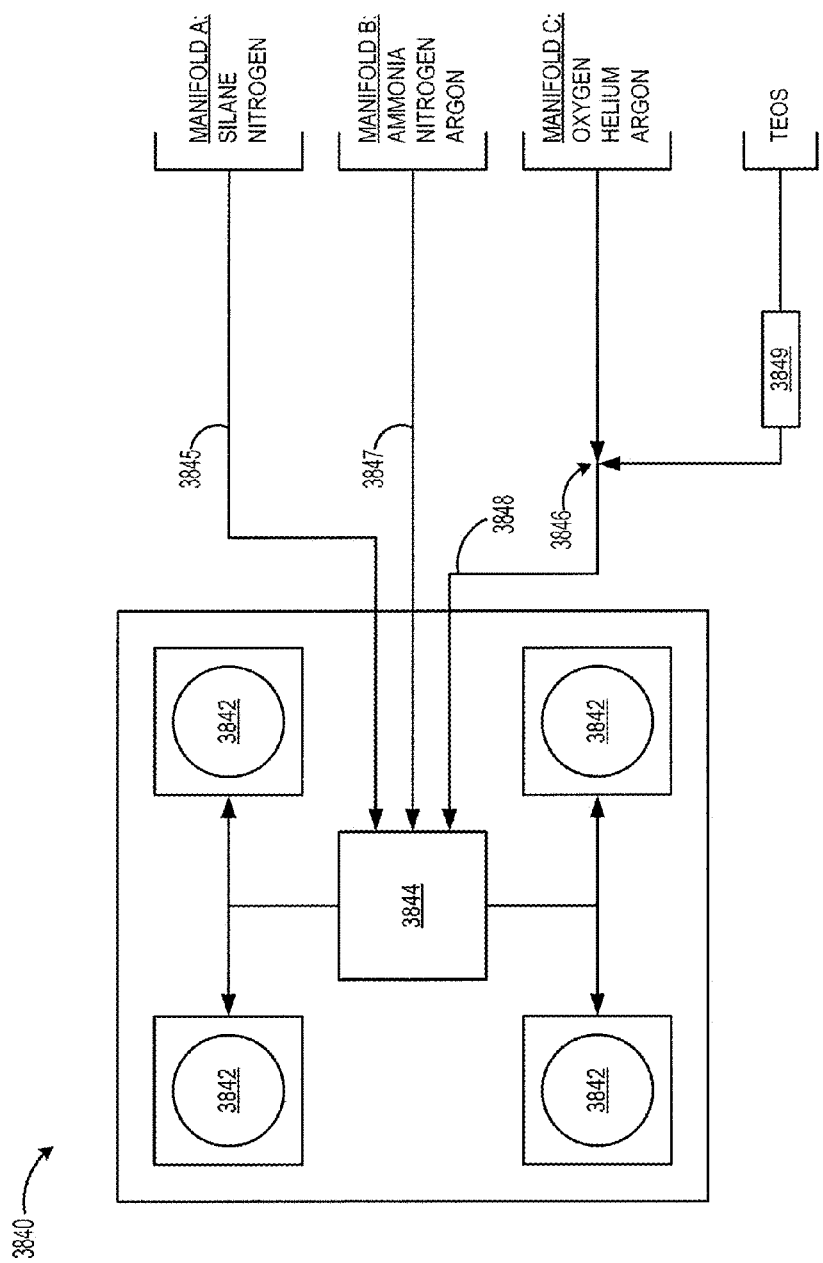
FIG. 5 schematically illustrates an example of a multi-station process tool according to an embodiment of the present disclosure.

FIG. 5 schematically shows an example process tool 3840, which includes a plurality of processing stations 3842 in a low-pressure environment. By maintaining each station in a low-pressure environment, defects caused by vacuum breaks between film deposition processes may be avoided. In the example shown in FIG. 5, each processing station 3842 is configured to deposit a film stack comprising multiple layers of TEOS-based silicon dioxide film and silane-based silicon nitride film. In certain such embodiments, such a film stack may comprise alternating layers of silicon dioxide film and silicon nitride film, one deposited atop the other. In the embodiment depicted in FIG. 5, process gases for each processing station 3842 are supplied by a common mixing vessel 3844 for blending and/or conditioning process gases prior to delivery. In some embodiments, mixing vessel 3844 may be temperature controlled. Process gases, including film precursors and reactants in a carrier gas as well as gases for plasma support, may be supplied from a plurality of process gas delivery lines and manifolds. For example, FIG. 5 depicts a manifold A including silane and nitrogen (as the carrier gas) fluidly communicating with a silane delivery line 3845; a manifold B including ammonia and nitrogen (again as a carrier gas) fluidly communicating with an ammonia delivery line 3847; and a manifold C including oxygen, helium, and argon fluidly communicating with a TEOS delivery line 3848. However, it will be appreciated that other suitable arrangements are included within the scope of the present disclosure. In one non-limiting example, helium and/or argon are provided to each of manifolds A, B, and C. In the example shown in FIG. 5, TEOS is introduced into TEOS delivery line 3848 fluidly communicating with manifold C at mixing point 3846. In some embodiments, liquid TEOS may be vaporized by optional vaporizer 3849 upstream of mixing point 3846.

Deposition of each film type may occur by a process that may include one or more of the above-described phases suitably modified for in-situ deposition of TEOS-based silicon dioxide films and silane-based silicon nitride films. Because each processing station 3842 is configured to provide each film type, additional purge and/or evacuation steps may be included within one or both processes to separate incompatible process gases. For example, in one scenario, residual oxygen adsorbed to plumbing surfaces may react with subsequently introduced silane to form fine silicon dioxide particulates. In another scenario, residual TEOS may react with subsequently introduced ammonia to form silicon oxynitride particulates. These particulates may be entrained during a gas flow event and may be distributed on the substrate surface as particle defects. As described above, one approach to addressing generation of such particles is by using one or more purge and/or evacuation cycles to displace incompatible process gases from surfaces and/or spaces shared by the process gases during transitions between deposition phases. In some embodiments, such a prior reactant/precursor elimination step may be accelerated by pumping the processing chamber to a base pressure—such as specifically described in detail above with respect to the reference pump-to-base (PTB) process. However, in other embodiments, a continuous plasma on (CPO) process, such as that described in detail above, may be employed as an alternative to a PTB-type process.

In some embodiments, separate mixing vessels may be employed, separating incompatible reactants and precursors and potentially reducing PTB, purge, and CPO times. For example, FIG. 6 schematically shows an embodiment example process tool 3990, which includes a plurality of processing stations 3992 in a low-pressure environment. In this example, process stations 3992 are configured to deposit a film stack comprising multiple layers of TEOS-based silicon dioxide films and silane-based silicon nitride films. In certain such embodiments, such a film stack may comprise alternating layers of silicon dioxide film and silicon nitride film, one deposited atop the other. Process gases may be supplied to process tool 3990 from a plurality of process gas manifolds, each of which may include any suitable process gas. For example, FIG. 6 depicts a manifold A including silane and nitrogen (as a carrier gas) fluidly communicating with process tool 3990; a manifold B including ammonia and nitrogen (as a carrier gas) fluidly communicating with process tool 3990; and a manifold C including oxygen, helium, and argon fluidly communicating with process tool 3990. However, it will be appreciated that other suitable arrangements are included within the scope of the present disclosure. In one non-limiting example, helium and/or argon are provided to each of manifolds A, B, and C. Oxide film reactants, shown in FIG. 6 as TEOS and oxygen, are delivered to each processing station 3992 via an oxide system mixing vessel 3994. In the example shown in FIG. 6, liquid TEOS may be vaporized by optional vaporizer 3999 and mixed with oxygen supplied from manifold C at mixing point 3991. Nitride film reactants, shown in FIG. 6 as silane and ammonia, are supplied via manifolds A and B, respectively, to each processing station 3992 via nitride system mixers 3995. In some embodiments, nitride system mixers 3995 may include dynamic or static mixing elements. In one non-limiting example, nitride system mixers 3995 may be static gas mixers including static, helically-shaped baffles. Additionally or alternatively, in some embodiments, nitride system mixers 3995 may include one or more heated mixing vessels. While FIG. 6 shows that process tool 3990 comprises two nitride system mixers 3995 for mixing nitride film reactants, it will be appreciated that any suitable number of nitride system mixers 3995 may be employed within the scope of the present disclosure. In some examples, three or more nitride system mixers may be used; in some other examples, a single nitride system mixer 3995 may be used, or the nitride system mixer 3995 may be omitted. In some embodiments, one or more nitride system mixers 3995 may include a mixing vessel. For example, in one scenario, one or more mixing vessels having no baffles may be substituted for one or more nitride system mixers 3995. In some embodiments, inert gases, such as argon, helium, and nitrogen, may be supplied to one or more process stations, providing purging, process gas dilution, and pressure control capability, as well as serving as a medium for plasma generation within the processing chamber. In some embodiments, argon is supplied through inert mixer 3996 to the processing chamber for use in generating an argon-based plasma. In certain such embodiments, the argon-based plasma may be used to accelerate elimination of contaminating species from the processing chamber, such as film precursors leftover from a previous film deposition step. In the example shown in FIG. 6, argon is provided to each process station 3992 via two inert mixers 3996. However, it will be appreciated that, in some embodiments, any suitable number of inert mixers 3996 may be employed, or in the alternative, that inert mixers 3996 may be omitted. In some embodiments, as illustrated in FIG. 6, a plurality of valves 3998 for each process station 3992 isolate upstream portions of the oxide film gas delivery plumbing from the nitride film gas delivery plumbing from one another and from a process station feed 3997. This may prevent reactions between incompatible reactants. In some embodiments, the arrangement of valves 3998 may comparatively reduce a volume of process station feed 3997, further reducing potential reactions between incompatible reactants. While FIG. 6 depicts three valves 3998 and a single process station feed 3997 serving each process station 3992, it will be appreciated that any suitable number of valves 3998 and process station feeds 3997 may be employed. For example, in some embodiments, each process gas may have a separate process station feed 3997 serving each process station 3992.

EXAMPLE

To compare the continuous plasma on (CPO) process with the reference pump-to-base (PTB) process, film stacks having alternating layers of silicon nitride and silicon oxide (SiN/SiOx stacks) were formed using both the reference PTB process of FIG. 1 and the CPO process of FIG. 2. The SiN/SiOx stacks were formed on 14 pairs of wafers for each process so that average stack defect count and total processing time could be compared. It is estimated that the stacks comprised 300 Å of silicon oxide (formed from TEOS precursor) and 500 Å of silicon nitride, except that: the 1st pair of wafers is estimated to have comprised 1300 Å of SiOx, the 2nd to have comprised 1000 Å of SiOx, the 12th to have comprised 1300 Å of SiOx, and the 14th pair of wafers to have comprised 2300 Å of SiOx.

The wafers were processed in batches, the stack defects in each batch counted, the total batch cycle times accumulated, and the results are listed in TABLE 1 below. Note that a stack defect is essentially a bump in the stack of SiN/SiOx films which forms when a particle lands on the stack during the deposition process. Once the contaminating particle has landed, subsequent layers of film deposited over the particle only act to magnify the size of the original bump. The bumps or stack defects were counted and categorized by size, specifically diameter, and the averages over several sets of batches are listed in TABLE 1.

Because a defect which exceeds a small size threshold also exceeds a larger size threshold, the defect count decreases going from left to right in TABLE 1 as the size thresholds increase, and thus the >0.13 µm defect category encompasses all the defects which were recorded. Averaging defects in the >0.13 µm category over all batches resulted in 63 defects per batch in stacks formed using the reference PTB process of FIGS. 1, and 32 defects per batch in stacks formed using the CPO process of FIG. 2. [Just to be clear, how many wafers per batch?] Note that this constitutes a nearly 50% reduction in stack defects. Furthermore, processing times improved significantly as well. As indicated in TABLE 1, total batch processing time is 6.5 minutes less using the CPO process relative to the reference PTB process constituting an improvement in processing time of over 20%.

TABLE 1

| | Stack Defects 14 pairs | | | | Batch Cycle |
|---|---|---|---|---|---|
| | >0.13 µm | >0.15 µm | >0.18 µm | >0.20 µm | >1.75 µm | Time (Min:Sec) |
| Reference PTB (Pump-to-Base) Process | | | | | |
| 1st three batches Average | 51 | 43 | 36 | 32 | 1 | 30:33 |
| 2nd three batches Average | 76 | 58 | 42 | 37 | 3 | |
| Total Average | 63 | | | 35 | 2 | |
| CPO (Continuous Plasma On) Process | | | | | |
| 1st three batches Average | 22 | 11 | 7 | 7 | 1 | 24:01 |
| 2nd three batches Average | 41 | 31 | 23 | 21 | 1 | |
| Total Average | 32 | | | 14 | 1 | |

Other Embodiments

Although the foregoing processes, systems, apparatuses, and compositions have been described in some detail for the purpose of promoting clarity of understanding, it will be apparent to one of ordinary skill in the art that certain changes and modifications may be practiced within the scope of the appended claims. It should be noted that there are many alternative ways of implementing the processes, systems, apparatuses, and compositions disclosed herein. Accordingly, the disclosed embodiments are to be considered as illustrative and not restrictive, and the scope of each appended claims is not to be limited to the specific details of the embodiments described herein.

We claim:

1. A method of forming a film stack comprising layers of silicon nitride film and silicon oxide film on a patterned semiconductor substrate in a processing chamber, the method comprising:
   (a) depositing a silicon nitride film layer via reaction of a nitrogen containing precursor with a first silicon containing precursor, the deposition accelerated by a plasma having a first plasma composition;
   (b) converting the plasma from having the first plasma composition to having a second plasma composition during which the plasma is continuously maintained in the processing chamber;
   (c) substantially eliminating the first silicon containing precursor from the processing chamber, the elimination accelerated by the plasma while it has the second plasma composition;
   (d) converting the plasma from having the second plasma composition to having a third plasma composition during which the plasma is continuously maintained in the processing chamber;
   (e) depositing a silicon oxide film layer via reaction of a second silicon containing precursor with an oxidant, the deposition accelerated by the plasma while it has the third plasma composition;
   (f) converting the plasma from having the third plasma composition to having a fourth plasma composition during which the plasma is continuously maintained in the processing chamber;
   (g) substantially eliminating the oxidant from the processing chamber, the elimination accelerated by the plasma while it has the fourth plasma composition;
   (h) converting the plasma from having the fourth plasma composition to having the first plasma composition during which the plasma is continuously maintained in the processing chamber; and
   (i) repeating (a)-(g) to form another silicon nitride film layer and another silicon oxide film layer.

2. The method of claim 1, wherein:
   substantially eliminating the oxidant from the processing chamber in (g) does not include a pump-to-base of the processing chamber below a base pressure of 0.5 torr; and
   substantially eliminating the first silicon containing precursor from the processing chamber in (c) does not include a pump-to-base of the processing chamber below a base pressure of 0.5 torr.

3. The method of claim 1, wherein the second silicon containing precursor is TEOS.

4. The method of claim 3, wherein the oxidant is oxygen.

5. The method of claim 4, wherein the first silicon containing precursor is silane.

6. The method of claim 5, wherein the nitrogen containing precursor is ammonia.

7. The method of claim 1, wherein the second plasma composition includes an inert gas species and the fourth plasma composition includes an inert gas species.

8. The method of claim 7, wherein:
   the elimination of the oxidant in (g) is further accelerated by purging the processing chamber with the inert gas species; and
   the elimination of the first silicon containing precursor in (c) is further accelerated by purging the processing chamber with the inert gas species.

9. The method of claim 8, wherein the inert gas species of the second plasma composition is argon, and the inert gas species of the fourth plasma composition is argon.

10. The method of claim 9, further comprising delivering argon to the processing chamber using a dedicated process gas delivery line, the dedicated process gas delivery line not used to deliver the first or second silicon containing precursors, the ammonia containing precursor, or the oxidant to the processing chamber.

11. The method of claim 9, wherein the first plasma composition includes nitrogen and the third plasma composition includes nitrogen.

12. The method of claim 1, wherein:
   the plasma while having the first plasma composition and while having the third plasma composition is maintained with:
   RF power having one or more frequencies between about 200 kHz and about 2000 kHz; and
   RF power having one or more frequencies between about 13.56 MHz and about 80 MHz; and the plasma while having the second plasma composition and while having the fourth plasma composition is maintained with:
RF power having one or more frequencies between about 13.56 MHz and about 80 MHz.

13. The method of claim 1, wherein the first and third plasma compositions comprise substantially the same chemical species in substantially the same concentrations, and wherein the second and fourth plasma compositions comprise substantially the same chemical species in substantially the same concentrations.

14. A method of forming a film stack comprising layers of silicon nitride film and silicon oxide film on a patterned semiconductor substrate in a processing chamber, the method comprising:
depositing a first silicon nitride film, the first silicon nitride film formed from the reaction of a nitrogen containing precursor with a first silicon containing precursor, the deposition accelerated by a plasma having a first plasma composition;
continuously maintaining a plasma in the processing chamber while converting the plasma having the first plasma composition into a plasma having a second plasma composition;
substantially eliminating the first silicon containing precursor from the processing chamber, the elimination accelerated by the plasma having the second plasma composition;
continuously maintaining a plasma in the processing chamber while converting the plasma having the second plasma composition into a plasma having a third plasma composition;
depositing a first silicon oxide film atop the first silicon nitride film, the first silicon oxide film formed from the reaction of a second silicon containing precursor with an oxidant, the deposition accelerated by the plasma having the third plasma composition;
continuously maintaining a plasma in the processing chamber while converting the plasma having the third plasma composition into a plasma having a fourth plasma composition;
substantially eliminating the oxidant from the processing chamber, the elimination accelerated by the plasma having the fourth plasma composition;
continuously maintaining a plasma in the processing chamber while converting the plasma having the fourth plasma composition into a plasma having substantially the first plasma composition;
depositing a second silicon nitride film atop the first silicon oxide film, the second silicon nitride film formed from the reaction of the nitrogen containing precursor with the first silicon containing precursor, the deposition accelerated by the plasma having substantially the first plasma composition;
continuously maintaining a plasma in the processing chamber while converting the plasma having substantially the first plasma composition into a plasma having substantially the second plasma composition;
repeating the step of substantially eliminating the first silicon containing precursor from the processing chamber, the elimination accelerated by the plasma having substantially the second plasma composition;
continuously maintaining a plasma in the processing chamber while converting the plasma having substantially the second plasma composition into a plasma having substantially the third plasma composition;
depositing a second silicon oxide film atop the second silicon nitride film, the second silicon oxide film formed from the reaction of the second silicon containing precursor with the oxidant, the deposition accelerated by the plasma having substantially the third plasma composition;
continuously maintaining a plasma in the processing chamber while converting the plasma having substantially the third plasma composition into a plasma having substantially the fourth plasma composition; and
repeating the step of substantially eliminating the oxidant from the processing chamber, the elimination accelerated by the plasma having substantially the fourth plasma composition.

* * * * *